(12) United States Patent
Chang

(10) Patent No.: US 7,982,227 B2
(45) Date of Patent: Jul. 19, 2011

(54) LIGHT EMITTING DIODE PACKAGE

(75) Inventor: Cheng-Yi Chang, Chung Ho (TW)

(73) Assignee: Everlight Electronics Co., Ltd., New Taipei (TW)

( * ) Notice: Subject to any disclaimer, the term of this patent is extended or adjusted under 35 U.S.C. 154(b) by 629 days.

(21) Appl. No.: 11/592,192

(22) Filed: Nov. 3, 2006

(65) Prior Publication Data

US 2007/0295970 A1    Dec. 27, 2007

(30) Foreign Application Priority Data

Jun. 27, 2006    (TW) ................................ 95123219 A

(51) Int. Cl.
*H01L 27/15*    (2006.01)
*H01L 31/12*    (2006.01)
*H01L 33/00*    (2006.01)
*B23K 1/00*    (2006.01)
*B23K 5/00*    (2006.01)

(52) U.S. Cl. ........ 257/82; 257/99; 257/E25.02; 257/E33.057; 228/6.2

(58) Field of Classification Search .............. 257/82, 257/99, E25.02, E33.057; 228/6.2
See application file for complete search history.

(56) References Cited

U.S. PATENT DOCUMENTS

| | | | |
|---|---|---|---|
| 4,894,751 A | 1/1990 | Wehnelt | |
| 5,265,792 A * | 11/1993 | Harrah et al. | 228/6.2 |
| 6,147,367 A | 11/2000 | Yang et al. | |
| 6,562,643 B2 | 5/2003 | Chen | |
| 6,770,498 B2 | 8/2004 | Hsu | |
| 6,914,267 B2 * | 7/2005 | Fukasawa et al. | 257/98 |
| 6,921,926 B2 | 7/2005 | Hsu | |
| 6,964,877 B2 * | 11/2005 | Chen et al. | 438/20 |
| 7,157,723 B2 * | 1/2007 | Colvin et al. | 250/458.1 |
| 7,714,346 B2 * | 5/2010 | Ogawa et al. | 257/99 |
| 2004/0266057 A1 | 12/2004 | Nagasawa | |
| 2005/0173721 A1 * | 8/2005 | Isoda | 257/99 |
| 2006/0151799 A1 * | 7/2006 | Watanabe et al. | 257/98 |

FOREIGN PATENT DOCUMENTS

| | | |
|---|---|---|
| CN | 2321116 Y | 5/1999 |
| CN | 2567786 Y | 8/2003 |
| DE | 39 05 657 A1 | 8/1990 |
| DE | 10246786 A1 * | 4/2004 |
| JP | 57079681 (A) | 5/1982 |
| JP | 11-112025 | 4/1999 |
| JP | 2002-324919 | 11/2002 |
| JP | 2003-179271 | 6/2003 |

(Continued)

*Primary Examiner* — Walter L Lindsay, Jr.
*Assistant Examiner* — Ron Pompey
(74) *Attorney, Agent, or Firm* — Han IP Law PLLC; Andy M. Han

(57) ABSTRACT

A base apparatus includes a base and two finger devices. The base has a first surface and two opposite sides. The finger devices are respectively mounted on the sides of the base, are made of conductive material, and each of the finger devices has multiple fingers. The fingers are extended on the first surface of the base, wherein the fingers of a first finger device are arranged respectively corresponding to the fingers of a second finger device whereby each pair of corresponding fingers supports an illuminating device. The base has a height, each of the fingers has a width and the width is smaller than the height. When the LED is mounted onto a substrate, the LED can be mounted on the substrate by its side so that an entire assembly height of the LED is reduced and is equal to the width of the LED.

9 Claims, 3 Drawing Sheets

FOREIGN PATENT DOCUMENTS

| TW | 522534 | 3/2003 |
| TW | 558846 | 10/2003 |
| TW | 594950 | 6/2004 |
| TW | I220563 | 8/2004 |

\* cited by examiner

LIGHT EMITTING DIODE PACKAGE

RELATED APPLICATIONS

The present application is based on, and claims priority from, Taiwan Application Serial Number 95123219, filed Jun. 27, 2006, the disclosure of which is hereby incorporated by reference herein in its entirety.

BACKGROUND

1. Field of Invention

The present invention relates to a light emitting diode (LED). More particularly, the present invention relates to a light emitting diode that can be mounted on a substrate by its side to provide an ultra-thin profile.

2. Description of Related Art

Portable electric devices such as personal digital assistants (PDAs) or cell phones are increasingly common and popular. The current trend for those portable devices is towards light, thin, short and small profile. Structure, operation and appearance are emphasized in the compact design of these portable devices so that they are convenient to carry and are competitive in the market. Therefore, components of those compact portable devices must have a small configuration.

Light emitting diodes (LEDs) used for surface mount devices (SMD) are needed to be smaller than general purpose LEDs. Therefore, the SMD type LEDs are extensively used in backlight modules of small-sized liquid crystal displays (LCDS) to be light sources, as well as in cell phones to illuminate the screen. Quality requirements of the SMD type LEDs are higher than the general purpose LEDs. A thin LED in accordance with the prior art is manufactured with a height about 350 micrometers, because the height of the die of the LED and process capability of manufacturing thin substrates restricts the package of the LED with a lower height. To manufacture an LED with a height smaller than 200 micrometers is difficult, and results in limited applications of the LED.

The prior art thins down and lowers other components (such as lead frame) of the LED to lower than the entire height of the LED package due to the inherent height of the die. However, to thin down the components weakens the component's stiffness, which causes the component to be easily deformed and broken during manufacturing processes. Therefore, the thinned components may be difficult to transport and store because the probability of being damaged during transportation and storage is raised, as well as manufacturing cost.

Therefore, there is a need to provide an LED with an improved base apparatus to mitigate or obviate the aforementioned problems.

SUMMARY

An object of the present invention is to provide an improved LED to reduce the entire assembly height when the LED is mounted on a substrate.

Another object of the present invention is to provide an improved LED to eliminate the thin LED being easily damaged during transportation or storage and increase the manufacturing quality.

A base apparatus for an LED in accordance with the present invention includes a base and two finger devices. The base has a first surface, a second surface opposite to the first surface and two opposite sides. The finger devices are respectively mounted on the sides of the base, are made of conductive material, and each of the finger devices has multiple fingers. The fingers are extended on the first surface of the base, wherein the fingers of a first finger device are arranged respectively corresponding to the fingers of a second finger device whereby each pair of corresponding fingers supports an illuminating device. The base has a height, each of the fingers has a width and the width is smaller than the height.

A method to manufacture the LED in accordance with the present invention comprises several steps. The first step is to prepare multiple illuminating devices where each of them has a first contact area and a second contact area. The illuminating devices are respectively mounted on and electrically connected to the pairs of corresponding fingers by conductive adhesive. A protective film is coated over the base apparatus to cover the illuminating devices and the connected fingers. Finally, the base apparatus is either cut or diced to separate the illuminating devices so that several individual LEDs are completed.

When the individual LED is mounted onto a substrate, the LED can be mounted on the substrate by its side so that an entire assembly height of the LED is reduced and is equal to the width of the LED, i.e. the width of the finger.

The LEDs in accordance with the present invention has several advantages.

First, the base apparatus provides a batch production capability for the LEDs. The LEDs can be manufactured in mass production to decrease cost. Further, the LEDs can be mounted on a substrate by its sides so that its entire assembly height is reduced when the LEDs are mounted on the substrate. Therefore, thin and weak components (such as thin substrate or leadframe) of the LEDs do not need to be used, eliminating damage to the components during transportation or storage. The cost of the LED is decreased, and the manufacturing quality of the LED is improved.

In addition, since the illuminating devices are mounted on the fingers in the vertical direction relative to the base apparatus, the current machining apparatus can be used without any modifications. Therefore, the present invention is easy to operate and use.

Third, the entire assembly height of the present invention is in the range of 50 to 100 micrometers when the LED is mounted on the substrate. The present invention is more suitable for being assembled in slim and thin electric devices than the conventional LED that the entire assembly height of the conventional LED is about 200 micrometers.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
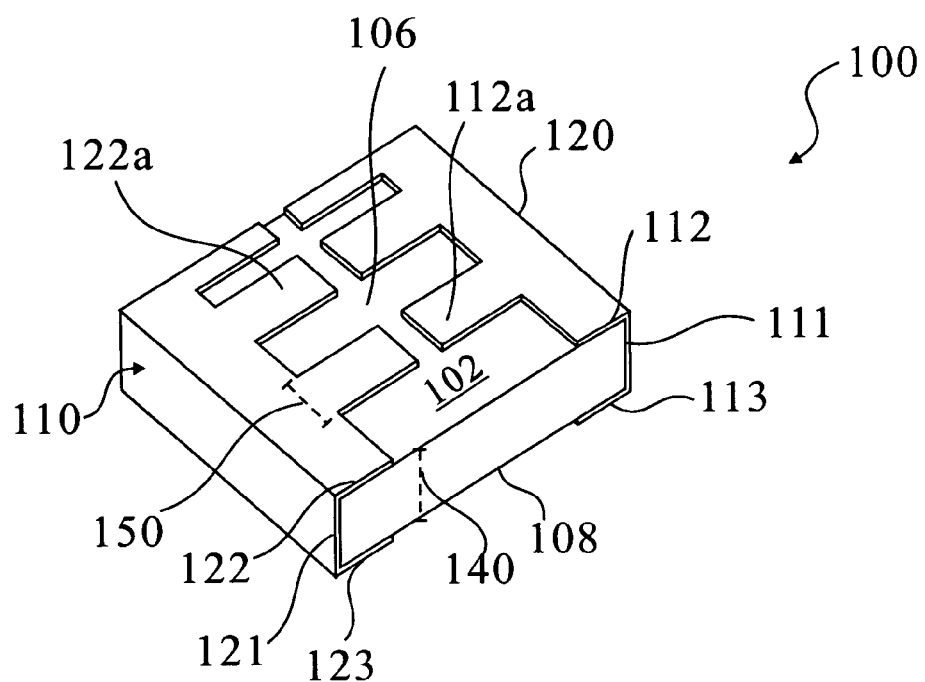
FIG. 1 is a perspective view of a base apparatus in accordance with the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
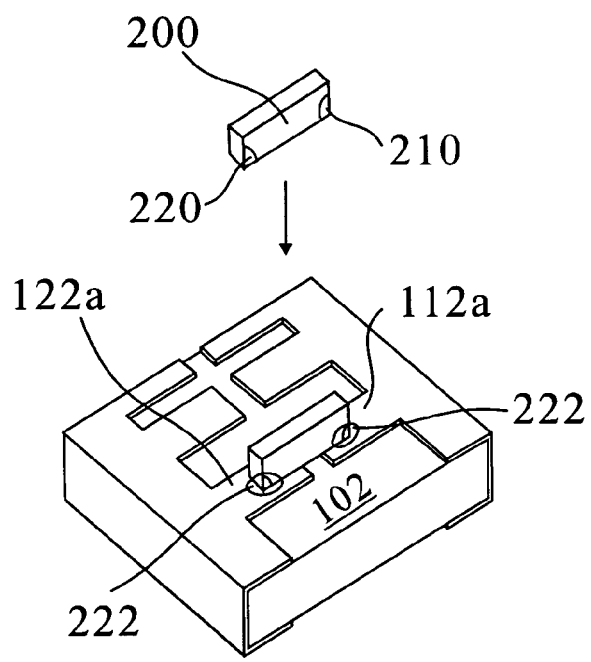
FIG. 2 is an exploded perspective view of the base apparatus in FIG. 1 when mounting an illuminating device.

Refer to FIG. 1 and FIG. 2. FIG. 1 is a perspective view of a base apparatus in accordance with the present invention, and FIG. 2 is an exploded perspective view of the base apparatus in FIG. 1 when mounting an illuminating device. A base apparatus 100 in accordance with the present invention of an LED comprises a base 102 and two finger devices 110,120 including a first finger device 110 and a second finger device 120. The base 102 has a first surface 106, a second surface 108 and two opposite sides. The first surface 106 is opposite to the second surface 108.

The finger devices 110,120 are respectively mounted at the sides of the base 102 and are made of conductive material. Each of the finger devices 110,120 comprises a joint portion 111,121, a first contacting portion 112,122 and a second contacting portion 113,123. The first contacting portions 112, 122 are mounted on the first surface 106 of the base 102 and respectively have multiple fingers 112a,122a. The first contacting portion 112 of the first finger device 110 includes multiple first fingers 112a, and the first contacting portion 122 of the second finger device 120 includes multiple second fingers 122a. The first fingers 112a are arranged to respectively correspond to the second fingers 122a. Therefore, each pair of corresponding fingers 112a,122a can be two electrodes for an illuminating device 200. Likewise, the second contacting portions 113,123 are mounted on the second surface 108 of the base 102.

The joint portions 111,121 are respectively attached to the sides of the base 102 and connect respectively to both the first contacting portions 112,122 and the second contacting portions 113,123.

Further, the base 102 has a height 140 and each of the fingers has a width 150. The width 150 is smaller than the height 140. The base 102 may be made of thermally conductive materials such as metal substrate, plastic substrate coated with diamond film, nano tubes, ceramic material such as aluminum oxide or aluminum nitride or composite material.

The illuminating device 200 is mounted on the pair of corresponding fingers 112a,122a of the finger devices 112, 122 and has a first contact area 210 and a second contact area 220. The first contact area 210 and the second contact area 220 are respectively and electrically connected to the corresponding fingers 112a,122a by conductive adhesive 222, solder or the like. The illuminating device 200 has a thickness in the range of 40 to 80 micrometers and can be a transparent substrate illuminating device such as a sapphire substrate illuminating device.

Figure 3:
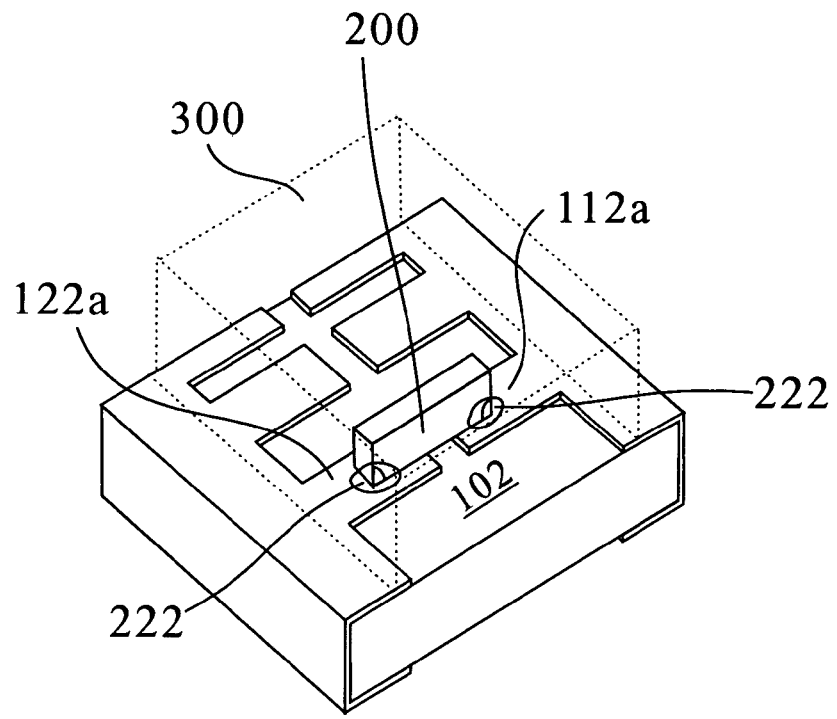
FIG. 3 is a perspective view of the base apparatus in FIG. 2 when the illuminating device is mounted.

Refer to FIG. 3. FIG. 3 is a perspective view of the base apparatus in FIG. 2 when the illuminating device is mounted. A protective film 300 is coated over the first surface 106 of the base 102 to cover the illuminating devices 200 and the fingers 112a,122a. FIG. 3 only shows one illuminating device 200 mounted on the fingers 112a,122a for illustrative purpose only, each pair of corresponding fingers 112a,122a are mounted with an illuminating device 200.

The protective film 300 is made of light-transmitting material, such as resin with high light transmittance. The resin with high light transmittance may include epoxy resin, polystyrene, acrylonitrile-butadiene-styrene (ABS), polymethyl methacrylate, acrylic or silica gel.

Figure 4:
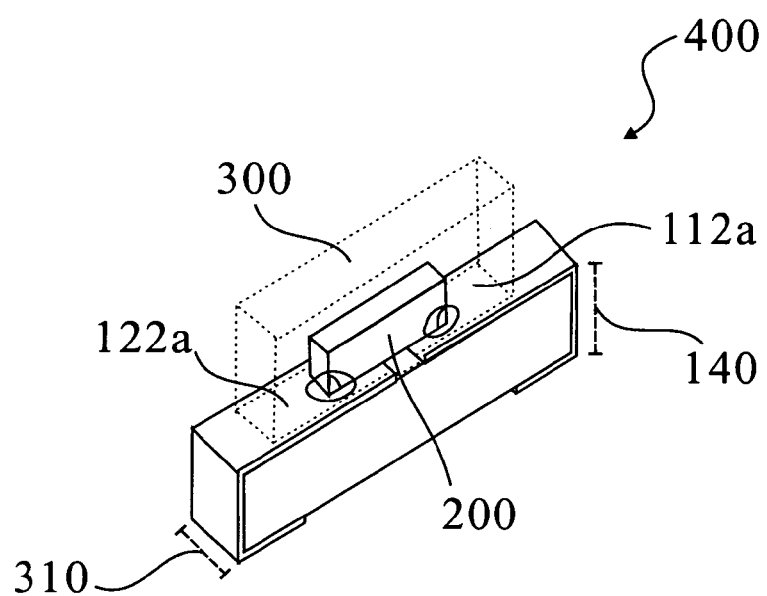
FIG. 4 is a perspective view of an LED after dicing the base assembly in FIG. 3.

Refer to FIG. 4. FIG. 4 is a perspective view of an LED after dicing the base assembly in FIG. 3. A single LED 400 is formed after singulation process for the base apparatus 100 as shown in FIG. 3. The LED 400 has a width 310 in the range of 50 to 100 micrometers, and the width 310 is smaller than the height 140 of the base 102. The LED 400 has two opposite sides that are substantially parallel to the orientation of the illuminating device 200.

Figure 5:
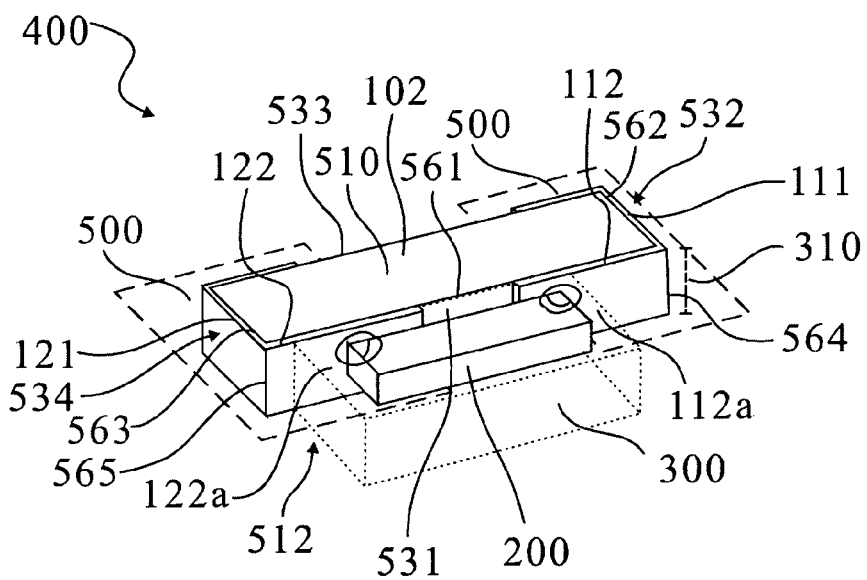
FIG. 5 is an operational perspective view of the LED in FIG. 4 when the LED is mounted on a substrate.

Refer to FIG. 5. FIG. 5 is an operational perspective view of the LED in FIG. 4 when the LED is mounted on a substrate. The LED 400 is mounted on a substrate 500 such as a printed circuit board (PCB) by its sides. The rest portion of the finger devices 110,120 of the LED 400 is connected to the substrate 500 by conductive adhesive so that electricity can be conducted to the illuminated device 200 through the fingers 112a, 122a. In the arrangement, the entire assembly height of the LED 400 is equal to the width 310 of the LED 400 as shown in FIG. 4, and is in the range of 50 to 100 micrometers as previously described. As illustrated in FIG. 5, the base 102 has a mounting surface 512 for attaching to the PCB 500 and a top surface 510 opposite to the mounting surface 512. The base 102 has a first side surface 531, a second side surface 532, a third side surface 533 and a fourth side surface 534 disposed between the top surface 510 and the mounting surface 512, respectively. A first finger 112a is disposed on the base 102 and extending from the first side surface 531 along the second side surface 532 to the third side surface 533. A second finger 122a disposed on the base 102 is electrically isolated with the first finger 112a. The second finger 122a is extended from the first side surface 531 along the fourth side surface 534 to the third side surface 533. A light emitting diode 200 is disposed on the first side surface 531 and electrically connected to the first finger 112a and the second finger 122a. A first edge 561 of the base 102 is formed between the top surface 510 (or the mounting surface 512) and the first side surface 531, a second edge 562 of the base 102 is formed between the top surface 510 (or the mounting surface 512) and the second side surface 532, a third edge 563 of the base 102 is formed between the top surface 510 (or the mounting surface 512) and the fourth side surface 534, a fourth edge 564 of the base 102 is formed between the first side surface 531 and the second side surface 532, a fifth edge 565 of the base 102 is formed between the first side surface 531 and the fourth side surface 534. The lengths of the fourth edge 564 and the fifth edge 565 are smaller than those of the first edge 561, the second edge 562 and the third edge 563.

Figure 6:
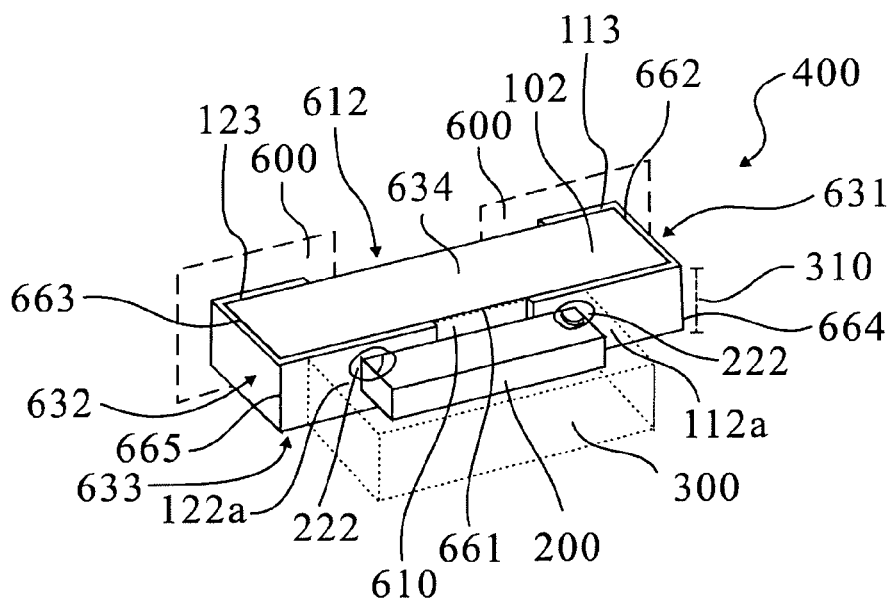
FIG. 6 is an operational perspective view of the LED in FIG. 5 in an alternative arrangement.

With reference to FIG. 6, FIG. 6 is an operational perspective view of the LED in FIG. 5 in an alternative arrangement. The LED 400 is connected to a substrate 600 in an alternative manner through the second contacting portion 113,123 of the rest portion of the finger devices 110, 120 of the LED 400. As illustrated in FIG. 6, a base 102 has a mounting surface 612 for attaching to the PCB 600 and a top surface 610 opposite to the mounting surface 612. The base 102 has a first side surface 631, a second side surface 632, a third side surface 633 and a fourth side surface 634, and the third side surface 633 is opposite to the fourth side surface 634. A first finger 112a is disposed on the base 102 and extending from the top surface 610 along the first side surface 631 to the mounting surface 612. A second finger 122a is disposed on the base 102 and electrically isolated with the first finger 112a. The second finger 122a is extended from the top surface 610 along the second side surface 632 to the mounting surface 612. A light emitting diode 200 is disposed on the top surface 610 and electrically connected to the first finger 112a and the second finger 122a. A first edge 661 of the base 102 is formed between the top surface 610 and the fourth side surface 634, a second edge 662 of the base 102 is formed between the first side surface 631 and the fourth side surface 634, a third edge 663 of the base 102 is formed between the second side surface 632 and the fourth side surface 634, a fourth edge 664 of the base 102 is formed between the top surface 610 and the first side surface 631, a fifth edge 665 of the base 102 is formed between the top surface 610 and the second side surface 632. The lengths of the fourth edge 664 and the fifth edge 665 are smaller than those of the first edge 661, the second edge 662 and the third edge 663.

The method to manufacture the LED 400 comprises several steps. The first step is to prepare multiple illuminating devices where each of them has a first contact area and a second contact area. The illuminating devices are respectively mounted on and electrically connected to the pairs of corresponding fingers by conductive adhesive. The protective film is coated over the base apparatus to cover the illuminating devices and the connected fingers. Finally, the base apparatus in cut or diced to separate the illuminating devices so that single LEDs 400 are completed by singulation process.

The LEDs in accordance with the present invention has several advantages.

First, the base apparatus provides a batch production capability for the single LEDs. The LEDs can be manufactured in mass production to decrease cost. Further, the LEDs can be mounted on a substrate by their sides so that its entire assembly height is reduced when the LEDs are mounted on the substrate. Therefore, thin and weak components (such as thin substrate or leadframe) of the LEDs do not need to be used, which eliminates damage to the components during transportation or storage. The cost of the LED is decreased, and the manufacturing quality of the LED is improved.

In addition, since the illuminating devices are mounted on the fingers in the vertical direction relative to the base apparatus, the current machining apparatus can be used without any modifications. Therefore, the present invention is easy to operate and use.

Third, the entire assembly height of the LED of the present invention is in the range of 50 to 100 micrometers when the LED is mounted on the substrate. The present invention is more suitable for being assembled in slim and thin electric devices than the conventional LED that the entire assembly height of the conventional LED is about 200 micrometers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An LED package, comprising:
   a base having a mounting surface for attaching to a substrate and a top surface opposite the mounting surface, the base having a first side surface, a second side surface, a third side surface and a fourth side surface disposed between the top surface and the mounting surface, respectively, such that the first side surface is adjacent the second side surface and the fourth side surface but opposite the third side surface, and such that the second side surface is adjacent the first side surface and the third side surface but opposite the fourth side surface;
   a first finger disposed on the base and extending from the first side surface along the second side surface to the third side surface;
   a second finger disposed on the base and electrically isolated from the first finger, the second finger extending from the first side surface along the fourth side surface to the third side surface; and
   a light emitting diode electrically connected to and disposed on a portion of the first finger that is disposed on the first side surface of the base and a portion of the second finger that is disposed on the first side surface of the base and being electrically connected to the first finger and the second finger, wherein at least a portion of a side of the first finger or a side of the second finger is substantially flush with the top surface on which neither the first finger nor the second finger is disposed.

2. The LED package as claimed in claim 1, wherein the base is made of a thermally conductive material.

3. The LED package as claimed in claim 2, wherein the thermally conductive material is selected from the group consisting of metal substrate, plastic, substrate with a diamond film, nano tubes, ceramic material and composite material.

4. The LED package as claimed in claim 3, wherein the ceramic material is aluminum oxide or aluminum nitride.

5. The LED package as claimed in claim 1, further comprising the substrate to which the mounting surface of the base is attached.

6. The LED package as claimed in claim 5, wherein the substrate is a printed circuit board (PCB).

7. The LED package as claimed in claim 1, wherein the base has a height, and wherein each of the first finger and the second finger has a respective width smaller than the height.

8. The LED package as claimed in claim 1, further comprising a protective film coated over the light emitting diode, the first finger, and the second finger.

9. The LED package as claimed in claim 8, wherein the protective film comprises a material selected from the group consisting of epoxy resin, polystyrene, acrylonitrile-butadiene-styrene (ABS), polymethyl methacrylate, acrylic or silica gel.

* * * * *